United States Patent [19]
Mozdzen et al.

[11] Patent Number: 5,706,484
[45] Date of Patent: Jan. 6, 1998

[54] METHOD FOR ELIMINATING TRANSITION DIRECTION SENSITIVE TIMING SKEWS IN A SOURCE SYNCHRONOUS DESIGN

[75] Inventors: Thomas J. Mozdzen, Gilbert, Ariz.; Harry Muljono, San Jose, Calif.

[73] Assignee: Intel Corporation, Santa Clara, Calif.

[21] Appl. No.: 575,933

[22] Filed: Dec. 20, 1995

[51] Int. Cl.$^6$ ..................................... G06F 1/04
[52] U.S. Cl. .................. 395/551; 395/306; 395/558; 395/559
[58] Field of Search ..................... 395/551, 553, 395/558, 559, 306, 309

[56] References Cited

U.S. PATENT DOCUMENTS

| | | | |
|---|---|---|---|
| 4,482,826 | 11/1984 | Ems et al. | 307/602 |
| 4,816,700 | 3/1989 | Imel | 307/269 |
| 4,881,165 | 11/1989 | Sager et al. | 395/551 |
| 5,015,872 | 5/1991 | Rein | 307/269 |
| 5,345,109 | 9/1994 | Mehta | 307/271 |
| 5,428,649 | 6/1995 | Cecchi | 375/372 |
| 5,486,783 | 1/1996 | Baumert et al. | 327/147 |
| 5,513,377 | 4/1996 | Capowski et al. | 395/881 |
| 5,576,652 | 11/1996 | Boehlke | 327/254 |
| 5,577,236 | 11/1996 | Johnson et al. | 395/551 |

*Primary Examiner*—Dennis M. Butler
*Attorney, Agent, or Firm*—Blakely, Sokoloff, Taylor & Zafman

[57] ABSTRACT

A source synchronous computer system to ensure the capturing of signals transmitted from a first component to a second component. An integrated circuit operating on a core clock signal and an I/O clock signal, the integrated circuit comprising a plurality of data drivers, an external I/O clock generator for transmitting the I/O clock signal, and an inverting external I/O clock generator for transmitting the compliment of the I/O clock signal, wherein the data drivers output data synchronous to the I/O clocks and both transmitted clock signals are combined in a receiving component to form a third clock. The receiving component capturing the outputted data synchronous to the third clock. By outputting data signals in the I/O clock domain and using the combination of the transmitted clock signals to synchronize transmission between external components, the computer system ensures that various output conditions that shift the rising or falling edge of a synchronizing clock are adjusted for by the receiving component generating a third clock that selects the later of the rising or falling clock edge between the transmitted clock signals. A set of data signals, the transmitted I/O clock signal, and the transmitted compliment I/O clock signal are generated from similar drivers and share a common power supply plane to further ensure that the data signals are asserted before the clocking edge of the generated third clock.

9 Claims, 5 Drawing Sheets

METHOD FOR ELIMINATING TRANSITION DIRECTION SENSITIVE TIMING SKEWS IN A SOURCE SYNCHRONOUS DESIGN

FIELD OF THE INVENTION

The present invention generally relates to reducing the output to output timing skews in a source synchronous design and more particularly to reducing the timing skews created by the timing differences between a low to high and a high to low logic transition of the data with respect to the synchronizing clock.

BACKGROUND OF THE INVENTION

External clock chips are often used to synchronize the timing between communicating chipsets. The external clock chip generates a system clock that is routed throughout the circuit board to different components for translation into an internal clock. The internal clock is then used by the individual components to generate internal and external signals. The extended routing of the system clock combined with the translation of the system clock to an internal clock by individual components results in timing variations at the interface of the different components. For systems operating at a low frequency most variations in timing interfaces are absorbed by the longer system clock cycle and any extreme timing variations are bypassed through the use of wait states added to the actual valid time of a signal. As microprocessor operating frequencies are improved system clock speeds must increase to fully utilize the benefits of a faster microprocessor, thus reducing the period of the system clock cycle and requiring additional use of wait states. This approach of adding wait states for a faster system clock imposes a relative performance penalty, especially in view of the fact that the microprocessor while operating at a higher frequency can remain idle during these wait states.

Source synchronous designs have been utilized to reduce the variation in timing interface between components. Source synchronous designs require the sharing of an input/output (I/O) clock between components that communicate frequently, thus reducing timing variations and limiting the addition of wait states. One drawback of such designs, however, is that various output switching conditions can cause a clocking edge of the driven I/O clock to fluctuate resulting in timing skews and the incorrect capture of data by the receiving component.

FIG. 1 shows a prior art shared clock system. CLOCK CHIP 130 is an external clock chip circuit generating system clock signals CLOCKIN 1 and CLOCKIN 2 for use by different components. Although this illustration shows CLOCK CHIP 130 coupled between a microprocessor, CPU 160, and EXTERNAL CHIPSET 170, typical shared clock systems have CLOCK CHIP 130 coupled to a large number of components. CPU 160 comprises an input CLOCKIN 1 coupled to PLL 100 and a bi-directional bus, DATABUS 3, coupled to I/O LOGIC 120. The CLOCKIN 1 signal is an output of the external CLOCK CHIP 130 and is used by CPU 160 to generate the internal clock I/O CLOCK 1 through the use of phase lock loop (PLL) circuitry, PLL 100. PLL 100 also generates PROCESSOR CLOCK which is routed throughout CPU 160 for use by CORE LOGIC 110. PROCESSOR CLOCK generally operates at a higher frequency than I/O CLOCK 1 because CORE LOGIC 110 does not have to communicate directly with EXTERNAL CHIPSET 170. Instead, CORE LOGIC 110 communicates to EXTERNAL CHIPSET 170 through I/O LOGIC 120. Similarly, CPU 160 can use I/O LOGIC 120 to communicate with other external components.

EXTERNAL CHIPSET 170 is typically an off chip component, such as a secondary level cache (L2 cache), that communicates with CPU 160 through the use of bus DATABUS 3. Communication along DATABUS 3 is synchronized through the use of internal clock I/O CLOCK 2 and I/O CLOCK 1. I/O CLOCK 2 is generated by PLL 140 for use in I/O LOGIC 150's latching circuitry. The use of different clocks, I/O CLOCK 1 to output signals along DATABUS 3, via I/O LOGIC 120, and I/O CLOCK 2 to receive signals from DATABUS 3, via I/O LOGIC 150, leads to a timing variation between CPU 160 and EXTERNAL CHIPSET 170.

As the speed of next generation microprocessor designs improves, shared clock systems have great difficulty synchronizing the high speed data transmission rates required by these next generation designs. For example, the use of a shared clock system between a microprocessor operating at a frequency of 120 megahertz (MHz) and a system clock operating at a frequency of 60 MHz may lead to a two cycle processor delay during the subsequent transmission of data to an external component. To improve the 60 MHz operating frequency of the system clock the timing variations created by the routing of external system clocks and the generation of multiple internal clocks would have to be reduced. Although efforts to reduce these timing variations have led to innovative system designs, the typical system clock does not operate at a frequency comparable to the microprocessor.

To circumvent the timing variations associated with shared clock system designs a source synchronous design is utilized, wherein a microprocessor shares its internal input/output (I/O) clock signal, used to generate its data outputs, with another component. Because the sharing of an internal I/O clock among different components reduces this timing variation and increases the data transmission speed, it may be desirable to have a source synchronous clocking scheme wherein an input/output clock is generated with a clocking edge that transitions subsequent to a data transmission.

SUMMARY OF THE INVENTION

A processor is described for use in a source synchronous design which outputs two I/O clock signals. The second I/O clock signal is complimentary to the first I/O clock signal. The I/O clock signals are used in the receiving components to generate a latching signal. The latching signal having a clocking edge that is the latter of the clocking edges between the driven I/O clock signal and the driven complimentary I/O clock signal.

In one embodiment, the I/O signals are generated by I/O clock generators which are coupled to a plurality of DATABUS drivers through a common supply source. By sharing a common supply with the databus drivers any noise in the supply source that delays the outputted data will also similarly delay the I/O clock signals. A first I/O clock generator and the compliment I/O clock generator share a common supply source with a databus driver and generate a first I/O clock signal and a first compliment I/O clock signal. The I/O clock signal and the compliment I/O clock signal are combined in the receiving component to synchronize latches used to capture the outputs from the databus drivers. Coupling the I/O clock generator to the databus drivers through a common power supply; dispersing the I/O clock generators among a group of databus drivers; transmitting complimentary I/O clock signals so that the receiving component can select the slowest transition edge; and using a similar driver for the I/O clock signal as the databus drivers, ensures that the latching clock signal generated by the receiving component captures valid data assertions.

3

BRIEF DESCRIPTION OF THE DRAWINGS

The present invention is illustrated by way of example and not limitation in the figures of the accompanying drawing, in which like references indicate similar elements, and in which.

DETAILED DESCRIPTION

A clocking scheme is described which uses a CMOS circuit that shares a common power supply with output drivers and generates input/output(I/O) clocks and complimentary I/O clock signals. The I/O clock signals are used for synchronizing data transmissions. As shown by the timing diagram of FIG. 5, I/O CLK 1 has a faster rising edge than I/O CLK. Similarly, I/O CLK 2 has a faster rising edge than the falling edge of I/O CLK. Although, I/O CLK 1 and I/O CLK 2 are driven as synchronizing signals in a source synchronous design their relative shift with regard to the data transmission signal I/O arises from the simultaneous switching of multiple outputs. For example, in FIG. 5 points G, H, and I along synchronizing clock I/O CLK 1 are shifted earlier than the rising edges of I/O CLK found at points D, E, and F. Thus, a receiving components latching DATA at point A expects the synchronizing signal to appear at point D; instead the synchronizing point occurs at point G causing the receiving component to latch the incorrect data.

A similar speed up is seen in I/O CLK 2 wherein the synchronizing transitions at points J1, K1 and L1 have shifted earlier than the falling edges at points D1, E1, and F1 of signal I/O CLK. This speed up may also cause the incorrect latching of data by receiving components that latch data along the falling edge of a synchronizing clock. Because various switching conditions affect either a low to high transition or a high to low transition of a clocking signal edge, both edges are simultaneously driven as outputs of the driving component; the receiving component can then select the latter edge from either signal for latching purposes. This design ensures that the receiving component generates synchronous clock edges that transition subsequent to a data output transition (for e.g., signal LATCHING CLK A in FIG. 5).

Figure 1:
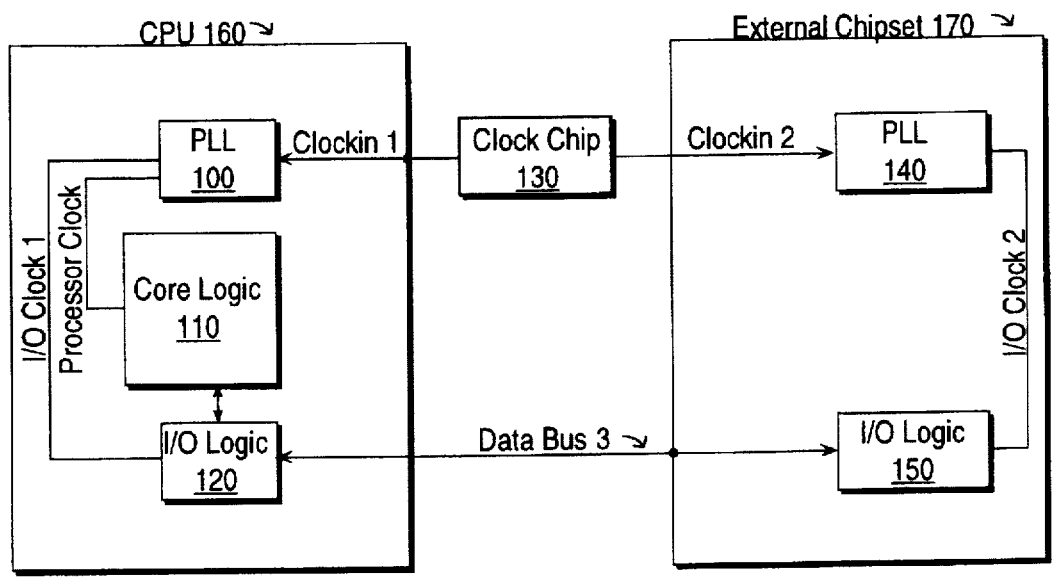
FIG. 1 is an illustration of a prior art implementation of a shared clock system.
Figure 2:
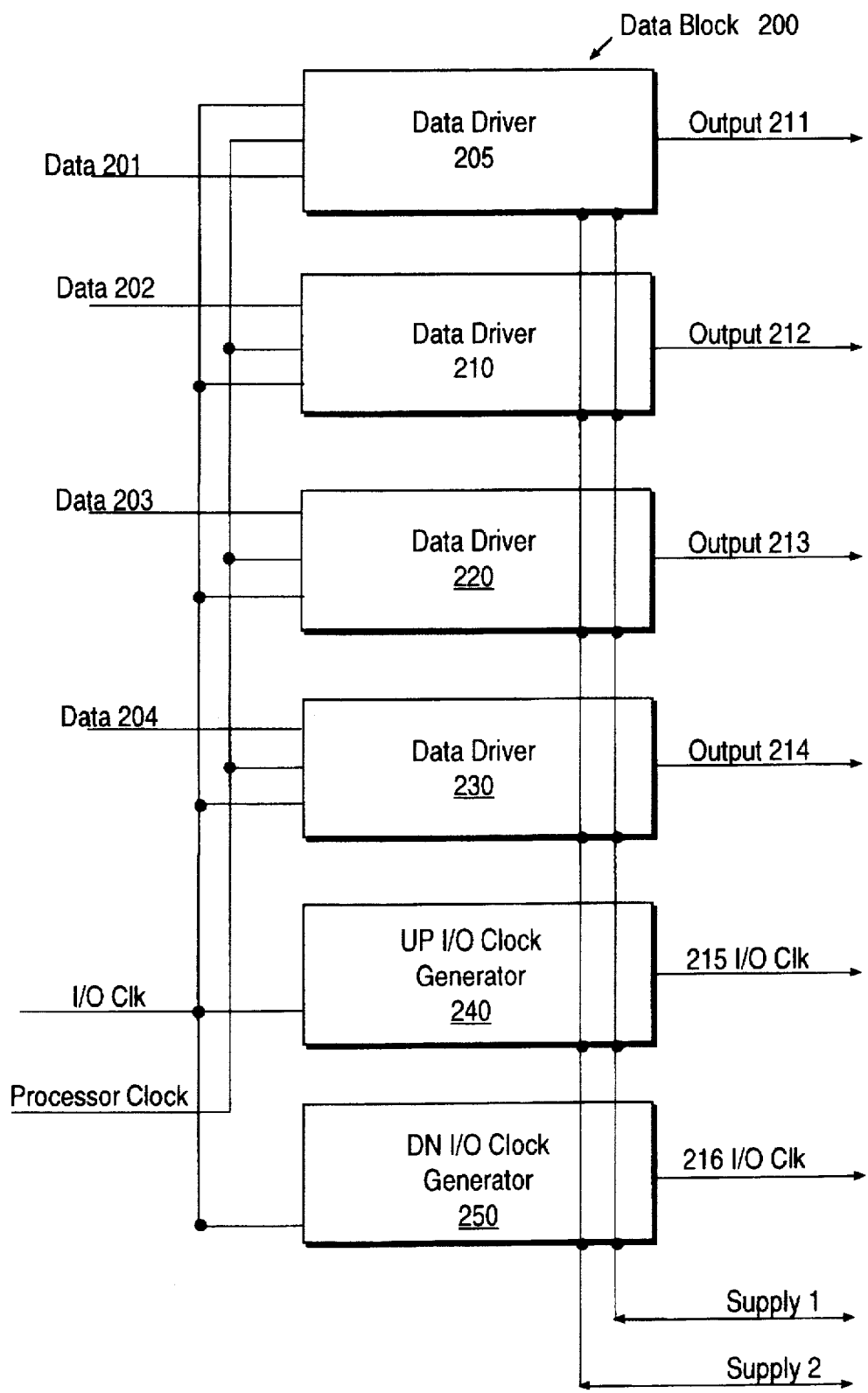
FIG. 2 is an illustration of one embodiment of the present invention wherein a group of data drivers are coupled to an I/O clock generator and a complimentary I/O clock generator.
Figure 3:
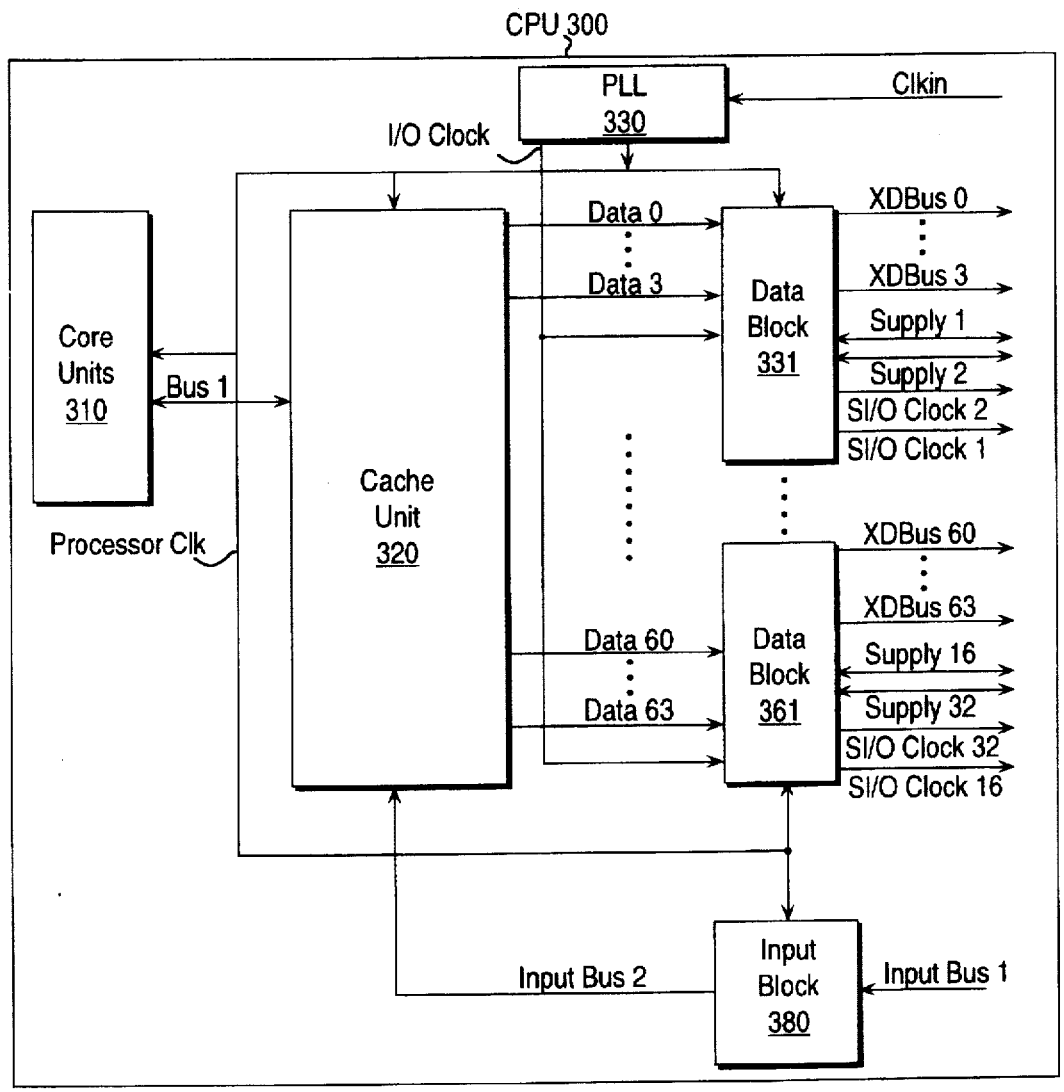
FIG. 3 is an illustration of another embodiment of the present invention wherein a CPU for use in a source synchronous design utilized in the circuit of FIG. 2, generates output signals and synchronizing clock signals.

While diagrams representing certain embodiments of the present invention are illustrated in FIGS. 2, 3, and 4 these illustrations are not intended to limit the invention. The specific circuits described herein are only meant to help clarify one's understanding of the present invention and to illustrate particular embodiments in which the present invention may be implemented. It will be appreciated that the broader spirit and scope of the present invention, as set forth in the appended claims, may be applied to any type of circuit which seeks the performance achievements attained by the present invention.

FIG. 2 shows DATA BLOCK 200 according to one embodiment. DATA DRIVERs 205, 210, 220, and 230 are used by DATA BLOCK 200 to generate OUTPUTS 211, 212, 213, and 214. The DATA DRIVERs 205, 210, 220, and 230 comprising ordinary circuits well-known in the art. By coupling DATA DRIVERs 205, 210, 220, and 230 to I/O CLK the outputs signals are generated with respect to the rising or falling edge of the external clocking signal I/O CLK. The DATA DRIVER circuits 205, 210, 220, and 230 are also coupled to PROCESSOR CLOCK and data inputs DATA 201, 202, 203, and 204. Using PROCESSOR CLOCK or I/O CLK, DATA DRIVERs 205, 210, 220, and 230 are able to latch corresponding data inputs DATA 201, 202, 203, and 204.

Figure 5:
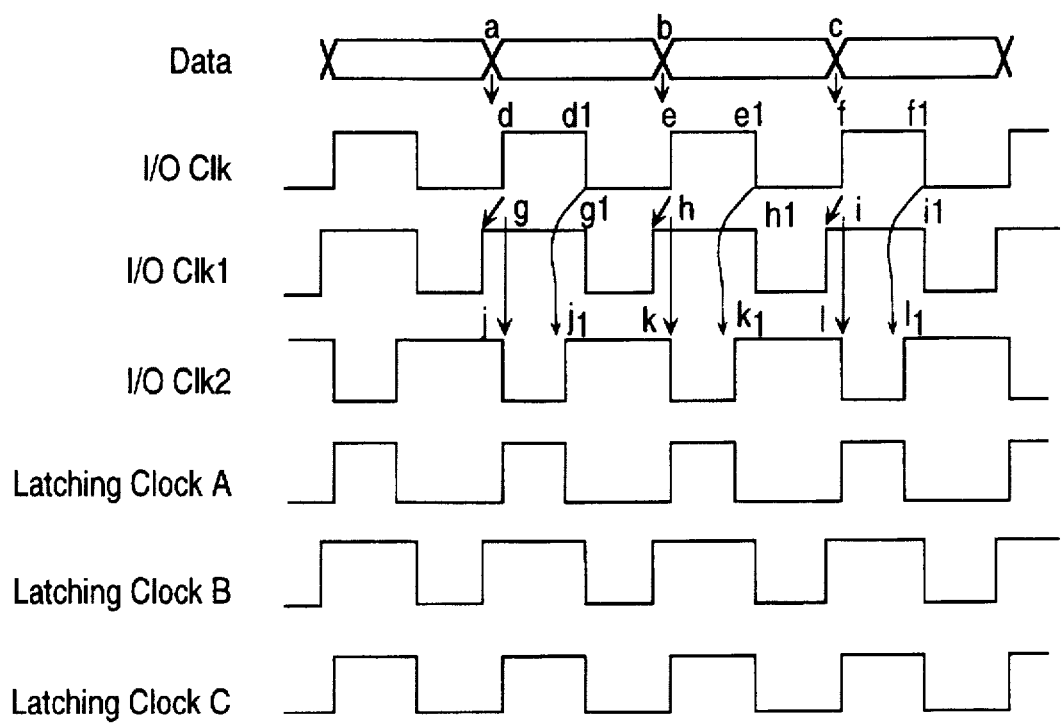
FIG. 5 is an illustration of the timing diagram showing the relationship between the I/O clock, the complimentary I/O clock, the latching clock, and the outputted data.

UP I/O CLOCK GENERATOR 240 is coupled to I/O CLK and is used by DATA BLOCK 200 to generate the external synchronizing clock signal 215 I/O CLK. Additionally, DN I/O CLOCK GENERATOR 250 is also coupled to I/O CLK and is used by DATA BLOCK 200 to generate the compliment of I/O CLK as an external synchronizing clock 216 I/O CLK. Both 215 I/O CLK and 216 I/O CLK are transmitted as synchronizing outputs because various output switching conditions can delay either the rising edge or the falling edge of a synchronizing clocking edge. Thus, by transmitting both signals the receiving component can select the clocking edge that is unaffected by the output switching. For example, FIG. 5 shows that I/O CLK1 has a shifted clocking edge at points G, H, and I while the inverse clock signal I/O CLK2 has clocking edges that are unaffected by output switch, shown as points J, K, and L. On the other hand, I/O CLK2 has clocking edges shifted by output switching at points J1, K1, and L1 while I/O CLK1 has unshifted clocking edges shown as points G1, H1, and I1. By outputting both I/O CLK1 and I/O CLK2, DATA BLOCK 200 allows the receiving component to select the latter clocking edge, rising or falling, to latch the transmitted data. In FIG. 5, the clocking edge selected being points J, G1, K, H1, L, and I1. The use of the slowest clocking edge for latching purposes ensure that the clocking edge is generated after the data is valid.

I/O CLOCK GENERATOR 240, I/O CLOCK GENERATOR 250 and data output driving circuitry DATA DRIVERs 205, 210, 220, 230 share a common pull-up potential SUPPLY 1 and a common pull-down potential SUPPLY 2. By sharing a common power supply any output switching combination that delays the generation of OUTPUTs 211, 212, 213, or 214 through the creation of noise in the power supply plane will also add delay to the generation of 215 I/O CLK and 216 I/O CLK. Thus, further ensuring that an external component selects the slowest clocking edge between 215 I/O CLK or 216 I/O CLK to latch OUTPUT 211, 212, 213 and 214 will utilize a clocking edge that transitions after OUTPUT 211, 212, 213, and 214 are valid.

FIG. 3 shows CPU 300 for use in a source synchronous design according to one embodiment. Input CLKIN is a system clock that is used by PLL 330 to generate clock signal I/O CLOCK. I/O CLOCK is coupled to the array of DATA BLOCKs 331-361 and is used by the DATA BLOCKs to synchronize the driving of data outputs XDBUS 0 through XDBUS 63. The DATA BLOCKs also generate outputs SI/O CLOCK 1 through SI/O CLOCK 32. The odd numbered SI/O CLOCK signals are the compliment signals of the even number S/IO CLOCK signals, an odd and even numbered SI/O CLOCK signal comprising a pair of SI/O signals. Each pair of SI/O CLOCK signals are associated with a group of data outputs. For example SI/O CLOCK 1 and SI/O CLOCK 2 are generated from the same DATA BLOCK 331 that generates data outputs XDBUS 0, 1, 2, and 3. Thus, the external receiving component (not shown) that latches outputs XDBUS 0, 1, 2, and 3 selects the later clocking edge between S/IO CLOCK 1 and S/IO CLOCK 2 to synchronously latch outputs XDBUS 0, 1, 2, and 3. I/O CLOCK is also coupled to INPUT BLOCK 380 and CACHE UNIT 320. INPUT BLOCK 380 passes signals from external inputs INPUTBUS 1 to CACHE UNIT 320 through INPUTBUS 2. CACHE UNIT 320 can process the signals from INPUTBUS 2 or pass the data to CORE UNITS 310 along BUS 1.

PLL 330 also generates PROCESSOR CLK. PROCESSOR CLK is coupled to CORE UNITS 310, CACHE UNIT 320, and DATA BLOCKs 331–361. CORE UNITS 310 use PROCESSOR CLK to synchronize signal transfers internally and along BUS 1 to CACHE UNIT 320. Data transferred along BUS 1 to CACHE UNIT 320 can be passed to DATA BLOCKs 331–361 through data lines DATA 0 through DATA 63 directly. This indirect data transfer between CORE UNITS 310 and DATA BLOCKs 331–361 allows CPU 300 to operate PROCESSOR CLK at a different frequency than I/O CLOCK because CORE UNITS 310 and CACHE UNIT 320 do not have to generate output signals XDBUS 0–63 directly.

Voltage supply nodes SUPPLY 1 through SUPPLY 32 are outputs of CPU 300. Two supply nodes are coupled to one DATA BLOCK and supply the operating potential for the DATA BLOCK. For example, DATA BLOCK 331 is coupled to SUPPLY 1 and SUPPLY 2. The separate supply nodes are used localize the power supply of each DATA BLOCK. Localizing the power supply between a pair of SI/O CLOCK signals and a set of XDBUS outputs ensures that the noise caused by the simultaneous switching of a set of XDBUS outputs causes a similar delay to the localized SI/O CLOCK signals.

Figure 4A:
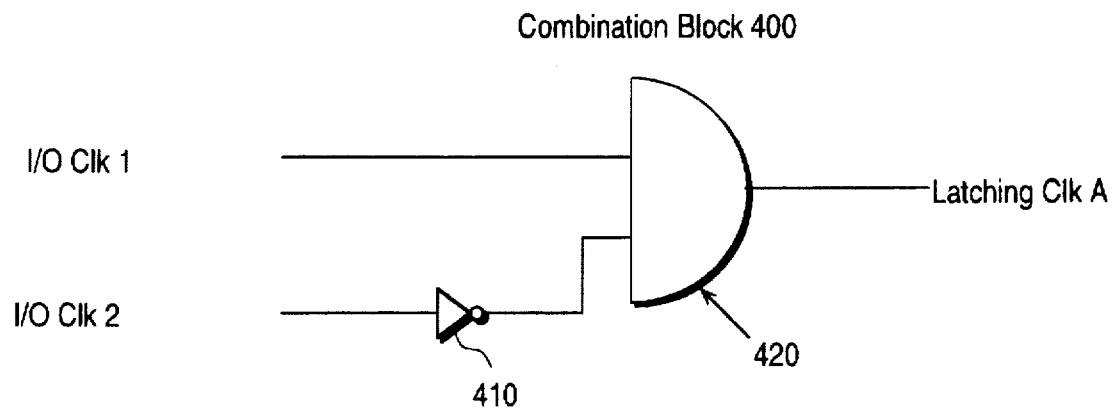
FIG. 4a is an illustration of the combinational logic used by the receiving component to synchronize the rising edge of the clock signals.

FIG. 4a is an illustration of COMBINATIONAL BLOCK 400 utilized by the receiving component to synchronize the rising edge of the clock signals. I/O CLK 1 is an external synchronizing clock signal driven by a transmitting component of FIG. 3. The output signal in FIG. 3 being SI/O CLOCK1. I/O CLK 2 is the complimentary signal of I/O CLK 1 also driven by the same transmitting component of FIG. 3 as output SI/O CLOCK 2. I/O CLK 2 is inverted by element 410 and logically anded to I/O CLK 1 by element 420. Element 420 then generates signal LATCHING CLK for use by the receiving component. COMBINATIONAL BLOCK 400 ensures that the slowest clocking edge between I/O CLK 1 and I/O CLK 2 is used to generate the rising edge of LATCHING CLK A.

Thus, the various output switching conditions that speed up the low to high or high to low transition of a synchronizing clock edge are masked out by COMBINATIONAL BLOCK 400 because COMBINATIONAL BLOCK 400 always selects the latter of the two clocking edges to synchronize the latching of data by the receiving component. As shown in FIG. 5, wherein the signal LATCHING CLK always has a synchronous clocking edge that is subsequent to data transitions at point A, B, and C.

Figure 4B:
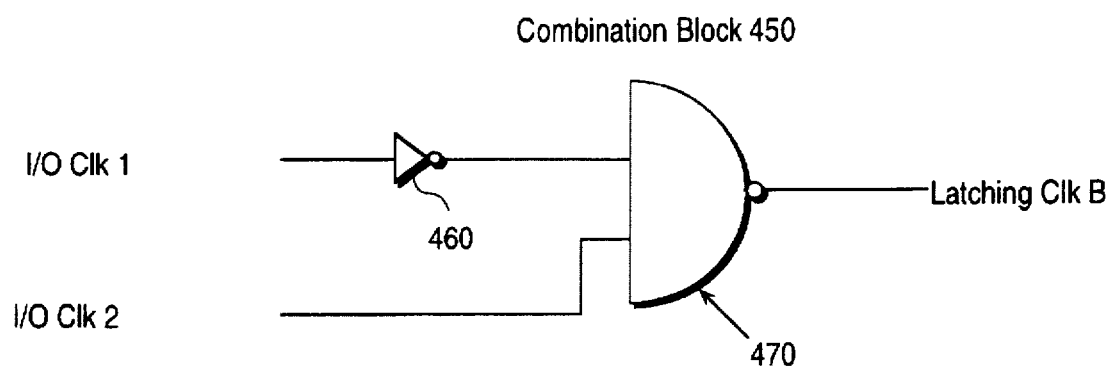
FIG. 4b is an illustration of the combinational logic used by the receiving component to synchronize the falling edge of the clock signals.

Similar circuitry to synchronize the falling edge of the clock signals is illustrated in FIG. 4b COMBINATIONAL BLOCK 450 illustrated in FIG. 4b, is utilized by the receiving component to synchronize the falling edge of the clock signals I/O CLK 1 and I/O CLK 2 OF FIG. 4b also correspond to the external synchronizing clock signals driven by a transmitting component of FIG. 3, as is discussed above with reference to FIG. 4a. I/O CLK 1 is inverted by element 460 and logically nanded to I/O CLK 2 by element 470. Element 470 then generates signal LATCHING CLK B for use by the receiving component. COMBINATIONAL BLOCK 450 ensures that the slowest clocking edge between I/O CLK1 and I/O CLK 2 is used to generate the falling edge of LATCHING CLK B, as is illustrated in FIG. 5.

Also illustrated in FIG. 5 is LATCHING CLK C. LATCHING CLK C is a signal wherein both the rising and falling edges have been synchronized. Although the circuitry used to generate LATCHING CLK C is not illustrated, it will be obvious to one with skill in the art in view of the circuitry illustrated in FIGS. 4a and 4b.

What is claimed is:

1. An integrated circuit having a plurality of functional units and a clock generator for generating a core clock signal and an input/output (I/O) clock signal, said plurality of functional units including a cache coupled to said core clock signal and an I/O unit coupled to said cache, said I/O unit comprising:

a plurality of data blocks coupled to said core clock signal and said I/O clock signal, each of said data block comprising:
a plurality of data bus drivers, each of said data bus drivers including a first input coupled to said cache and a first output synchronized via said I/O clock signal, said data bus driver for receiving data from said functional units and outputting said data external to said integrated circuit via said first output;
a plurality of first I/O clock generators coupled to said I/O clock signal, said first I/O clock generators outputting a first I/O clock signal via an external clock output, wherein said first I/O clock signal follows the timing of said I/O clock signal;
a plurality of second I/O clock generators coupled to said I/O clock signal, said second I/O clock generators outputting a second I/O clock signal via an external clock output, wherein said second I/O clock signal is an inverse of said I/O clock signal and follows the timing of said I/O clock signal;
a common pull-up supply plane coupled between said data bus drivers, said first I/O clock generators, and said second I/O clock generators; and
a common pull-down supply plane coupled between said data bus drivers, said first I/O clock generator, and said second I/O clock generator.

2. The integrated circuit of claim 1 wherein said data bus drivers are grouped into sets, each set including a first I/O clock generator and a second I/O clock generator, wherein each set having a different common pull-up supply plane and a different common pull-down plane.

3. A method for reducing the timing skews introduced by various output switching conditions that shift the clocking edges of shared clock signals in a source synchronous design, wherein synchronizing clocks and compliments of said synchronizing clocks are combined to synchronize signal transmissions between a plurality of components, said method comprising:

(a) generating a first clock signal within a first component;
(b) transmitting data signals from said first component synchronous with said first clock signal;
(c) transmitting a plurality of first clock signals from said first component to a second component via a plurality of first drivers;

(d) transmitting a plurality of second clock signals from said first component to said second component, wherein each of said second clock signals is a compliment of said first clock signal and is transmitted via a plurality of second drivers;

(e) creating sets of data signals, wherein each of said sets of data signals is associated with a single transmitted first clock signal and a single transmitted second clock signal; and (f) synchronously capturing a set of said data signals in said second component with a combination of a transmitted first clock signal and a transmitted second clock signal, wherein both said transmitted first clock signal and said transmitted second clock signal are associated with said set of data signals.

4. The method of claim 3 further comprising the steps of:

sharing a pull-up power supply plane between said set of data signals, said single transmitted first clock, and said single transmitted second clock signal;

sharing a pull-down power supply plane between said set of data signals, said single transmitted first clock, and said single transmitted, second clock signal; and generating said data signals, said single transmitted first clock, and said single transmitted second clock signal for a given set.

5. The method of claim 3 wherein a single synchronizing clock and a single complimentary synchronizing clock are used to synchronize signal transmission, step (c) of said method further comprising the step of transmitting a single first clock signal and step (d) further comprising the step of transmitting a single second clock signal for synchronizing signal transmission between said plurality of components.

6. The method of claim 3 wherein said step of combining said transmitted first clock signal and said transmitted second clock signal of step (f) further comprises:

inverting said second clock and logically anding said first clock signal to said inverted second clock signal.

7. A source synchronous computer system for reducing wait states and delays between components of said source synchronous computer system, comprising:

a first component and a second component, said first component coupled to said second component, wherein said first component generates data that is synchronously captured by said second component, said first component comprising:

a system clock input;

a plurality of first supply output nodes;

a plurality of second supply output nodes;

a first circuit coupled to said system clock input, wherein said first circuit generates a first clock signal and a second clock signal, said first clock signal for synchronizing external data transmissions, said second clock signal for synchronizing internal data transmissions;

a second circuit coupled between said first clock signal, said second clock signal, and a plurality of input nodes, wherein said second circuit receives external data via said input nodes and generates a plurality of internal data signals;

a plurality of m data driver circuits, wherein each of said m data driver circuits generates an external data output signal of said first component synchronized to said first clock signal, wherein each of said data driver circuits is coupled to an internal data signal via a first input, a data output node for outputting said data signal, a first supply node, and a second supply node;

a plurality of n first clock circuits for transmitting n external first clock signals, wherein each of said first clock circuits is coupled to a first supply node, a second supply node, said first clock signal, and a first clock output node for transmitting one of said n external first clock signals;

a plurality of n second clock circuits for transmitting n external compliment clock signals, said n external compliment clock signals being inversions of said first clock signal, wherein each of said second clock circuits is coupled to a first supply node, a second supply node, said first clock signal, and a second clock output node for transmitting one of said n external compliment clock signals;

an external output bus including said data output nodes of said m data driver circuits; and a second component comprising:

a plurality of third clock generators for generating a plurality of third clock signals, wherein each of said third clock generators is coupled to an n external clock signal and an n external compliment clock signal, said third clock generator for logically combining said external clock signals and said compliment external clock signals and outputting a third clock signal; and a plurality of m receiving circuits for synchronously capturing m data signals from said external output bus, wherein each of said receiving circuits is coupled to a node of said external data bus via a first input and to a third clock signal via a second input.

8. The source synchronous computer system of claim 7 wherein said third clock signal is generated by a third clock circuit wherein said third clock circuit logically ands said external clock signal with an inversion of said external compliment clock signal.

9. The source synchronous computer system of claim 7 wherein said data driver circuits of the said component are divided into n sets of signals, each set comprising:

m/n data driver circuits sharing a common power supply plane with one of said n first clock circuits and one of said n second clock circuits;

each of said m/n driver circuits having a first final stage driver circuit to drive said data output node;

each one of said n first clock circuits associated with said m/n data driver circuits having a first final stage driver circuit to drive said first clock output node; and each one of said n second clock circuits associated with said m/n data driver circuits having a second final stage driver circuit to drive said second clock output node.

* * * * *